United States Patent [19]

Kadono et al.

[11] Patent Number: 4,702,935

[45] Date of Patent: Oct. 27, 1987

[54] PRODUCTION METHOD OF A HIGH MAGNETIC PERMEABILITY ALLOY FILM

[75] Inventors: Masaru Kadono; Kumio Nago; Tatsushi Yamamoto; Tersuro Muramatsu; Shuuhei Tsuchimoto; Mitsuhiko Yoshikawa, all of Nara; Masatoshi Tomita, Hyogo, all of Japan

[73] Assignee: Sharp Kabushiki Kaisha, Osaka, Japan

[21] Appl. No.: 663,128

[22] Filed: Oct. 22, 1984
(Under 37 CFR 1.47)

[51] Int. Cl.⁴ .................... B05D 3/06; C23C 16/06
[52] U.S. Cl. ................................ 427/42; 427/129;
427/132; 427/250; 427/255; 427/314; 427/319
[58] Field of Search ............... 427/42, 124, 132, 129, 427/250, 255, 314, 319

[56] References Cited

U.S. PATENT DOCUMENTS 4,354,908 10/1982 Shirahata et al. .................. 427/250
4,390,601 6/1983 Ono et al. ............................. 427/250

FOREIGN PATENT DOCUMENTS 60-145602 8/1985 Japan ................................. 427/255.3

*Primary Examiner*—Sadie L. Childs
*Attorney, Agent, or Firm*—Birch, Stewart, Kolasch & Birch

[57] ABSTRACT

A production method for producing a high permeability alloy film which includes evaporating an alloy material composed of 1–6 wt % Al, 20–35 wt % Si, and the remainder of iron by irradiating the alloy with an electron beam, and then depositing the vapor from the alloy material onto a substrate for a predetermined time to produce an alloy film composition having a high permeability. The vapor deposition onto the substrate is preferably intercepted with the shutter until the concentration of aluminum of the vapor to be deposited has been decreased to a value between 20 and about 4 wt %.

13 Claims, 4 Drawing Figures

PRODUCTION METHOD OF A HIGH MAGNETIC PERMEABILITY ALLOY FILM

BACKGROUND OF THE INVENTION

1. Field of the Invention

This invention relates to a new method for producing a high magnetic permeablility alloy film composed of iron, aluminum and silicon.

2. Description of the Prior Art

Recently, the enhancement of recording density is demanded in the field of magnetic recording technology in order to adapt to the diverse information to be recorded. Therefore, it is also demanded to obtain a magnetic head having a narrower track width and a narrower gap length, and including a material of a high magnetic permeability and a high saturation magnetization.

A Sendust alloy composed of iron, aluminum and silicon has been well known to be suitable as a magnetic head material because it has a high magnetic permeability, a high saturation magnetization and good wear resistance.

It has been well known that the magnetic permeability of an alloy of the iron-aluminum-silicon system varies largely with the composition thereof. Alloys of iron-aluminum-silicon system which show narrow and sharp peaks of magnetic permeability are known as Sendust alloys. A Sendust alloy for practical use is usually composed of 6 wt % Al, 9.5 wt % Si, and the remainder of Fe. On producing a Sendust alloy film, the control of the composition thereof is an essential problem to obtain excellent magnetic characteristics. The term "Sendust alloy" will hereinafter be referred to a high magnetic permeability alloy in a rather broad range of the composition in the iron-aluminum-silicon system.

Conventionally, the following methods have been used to produce a Sendust alloy film. (1) A process of polishing a bulk Sendust alloy into a film of a predetermined thickness. (2) A sputtering method of preparing a Sendust alloy film of a predetermined thickness. (3) A rapidly quenched method to form a Sendust alloy film. However, these methods have the following disadvantages. As for the first method, it is difficult to cut and to dice a bulk material because of the brittleness thereof. It is also difficult to precisely control the film thickness. The second method is not appropriate to form a relatively thick film because of its very slow deposition rate. Finally, the third method does not allow precise control of the film thickness because the film thickness is easily influenced by the processing conditions. The brittleness and the largeness of grain size of a rapidly quenched film remains a problem to be solved; the former causes troubles during a shaping process, and the latter limits the frequency characteristics.

SUMMARY OF THE INVENTION

It is, accordingly, an object of the present invention to provide a new production method of a ternary alloy film composed of iron, aluminum and silicon, allowing the production of a Sendust alloy with a high magnetic permeability at high depostion rate.

In accordance with the present invention, a new production method of a high magnetic permeability alloy film is provided. In the processes of the present invention, an alloy material composed of 1-6 wt % Al, 20-35 wt % Si and the remainder of iron is evaporated by irradiation of an electron beam thereon. The vapor of the alloy material is deposited onto a substrate for a predetermined time which is needed to obtain a composition of the deposited film so as to have a high magnetic permeability.

A Sendust alloy film produced according to the present invention is applicable to a magnetic recording head because it has good frequency characteristics.

Another advantage of the present invention is that the very high deposition rate is as fast as 0.1–1 $\mu$m/min in the production of a film. This becomes available by adopting a vacuum deposition process with an electron beam. The high deposition rate is a very essential factor in the production of high magnetic permeability alloy films having a thickness appropriate for a core of a magnetic head.

A further advantage of the present invention is that a batch production of cores of magnetic head is possible by using a deposition process and a dry etching process.

BRIEF DESCRIPTION OF THE DRAWINGS

The detailed description of the invention will now be described by way of example with reference to the accompanying drawings.

DETAILED DESCRIPTION OF THE INVENTION

Until now, no one has succeeded in producing a Sendust alloy film by using a vapor deposition process with an electron beam. This is ascribable to the large difference in the vapor pressures of the three components, iron, aluminum and silicon under vacuum deposition. These differences are so large that it is extremely difficult to deposit a film of a proper composition as a Sendust alloy. For the first time, the inventors have made it possible to produce a Sendust alloy film of high quality by evaporating an alloy material composed of 1-6 wt % Al, 20-35 wt % Si and the remainder of iron with an electron beam, and by controlling the deposition time.

Figure 1:
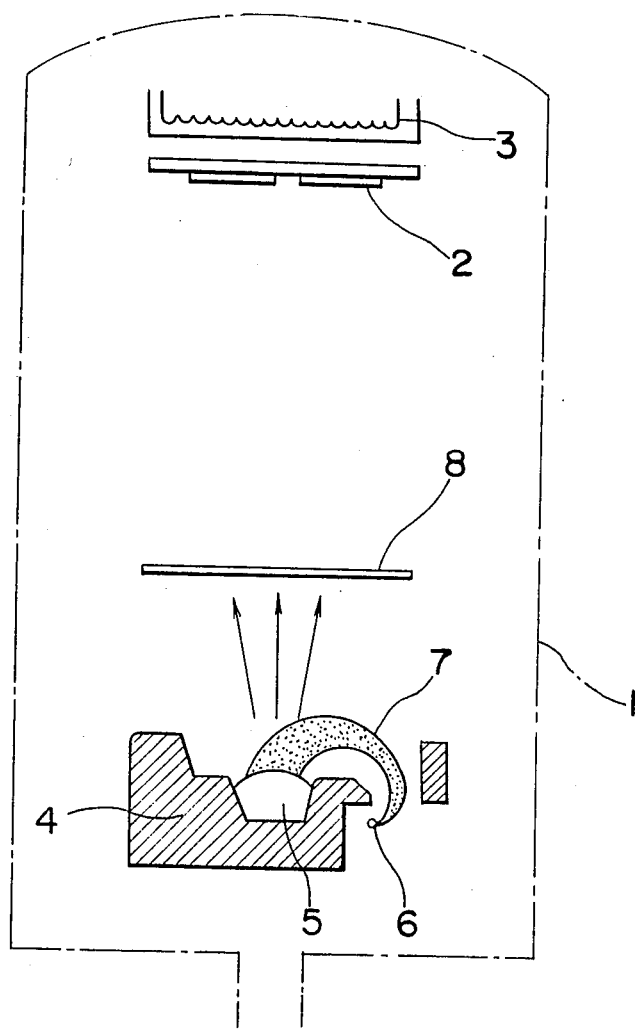
FIG. 1 is a schematic cross-sectional view of an electron beam deposition apparatus used in the present embodiments.

FIG. 1 shows an electron beam deposition apparatus which has been used in a production process according to the present invention. Substrates 2 on which the vapor is deposited are supported by a suitable support means in the upper space of a bell jar 1. The space inside the bell jar 1 is kept under high vacuum during the deposition. A heater 3 is provided just above the substrate 2 in order to heat them. A hearth 4 is provided in the lower space of the bell jar 1, and an alloy tablet 5 is placed on the hearth 4. A filament 6 is set beside the hearth 4, and an electron beam 7 generated by the filament 6 is so forced as to curve under magnetic field generated in the neighorhood of the hearth 4 and irradiates the alloy tablet 5. A shutter 8 is set between the substrates 2 and the hearth 4. This shutter 8 is used to control the components of a deposited film by intercepting or passing the vapor of the alloy tablet 5. The alloy tablet 5 composed of 1-6 wt % Al, 20-35 wt % Si and the remainder of iron have been prepared by melting in vacuum. It is desirable that the substrates 2 have the thermal expansion coefficient nearly as large as that of a Sendust alloy 100-180 ($\times 10^{-7}$ deg$^{-1}$). The following materials are suitable as a substrate: photosensitive glass such as "Photoceram" of Corning Glass Works and "PEG" series of Hoya Corp., crystalline glass, nonmagnetic ferrite, ceramics and stainless steel (SUS 304).

A Sendust alloy film is produced by using the abovementioned electron beam deposition apparatus. The alloy tablet 5 composed of 4 wt % Al, 27.5 wt % Si and the remainder of iron is put in the hearth 4. Substrates 2 are heated with the heater 3 up to a temperature between 100° and 600° C., preferably at 400° C., in order to improve the adherence between a film to be deposited and the substrate 2. The input power for the electron gun in the deposition process is set to be 10 kW. An electron beam 7 is swept over the entire surface of the alloy tablet 5 in the X and Y directions in order to heat the alloy tablet homogeneously. The shutter 8 is kept shut until one minute passes after the input power for the electron gun has increased to 10 kW. Then, the shutter 8 is opened, and the vapor is deposited on the substrate 2. Four kinds of deposited film are obtained by settig the deposition time each at 5, 10, 20 and 30 minutes, herein the deposition time is counted after the shutter 8 is opened.

The following Table shows the composition of the four films obtained as the result of the chemical analysis.

TABLE

| Deposition time (min) | Composition (wt %) |
| --- | --- |
| 5 | Fe—11.4 Al—7.3 Si |
| 10 | Fe—8.1 Al—8.0 Si |
| 20 | Fe—7.0 Al—10.2 Si |
| 30 | Fe—5.0 Al—12.9 Si |

As is clear from the Table, the composition of the films are found to vary in a correlated manner with each other depending on the deposition time. However, it is found that a film having a composition which shows a high magnetic permeability alloy mentioned above (for example, 6 wt % Al and 9.5 wt % Si) can be produced by controlling the deposition time.

Figure 2:
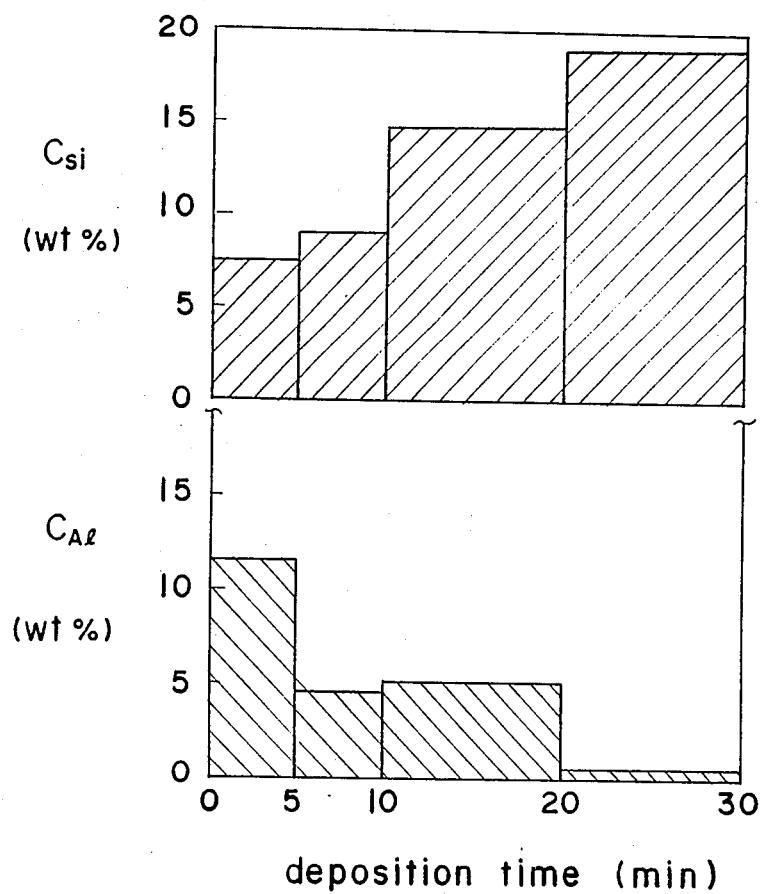
FIG. 2 is a graph of the time dependence of the silicon concentration $C_{Si}$ and the aluminum concentration $C_{Al}$ of a deposited film.

The time dependencies of the concentrations of silicon $C_{Si}$ and of aluminum $C_{Al}$ of a deposited film are shown in FIG. 2. The data shown in FIG. 2 are obtained by making use of the data of the four films shown in the Table. It is apparent that the composition of a deposited film varies largely with the deposition time. It is to be understood that the composition of the vapor of the alloy tablet 5 varies with time due to the differences among the vapor pressures of the three components of the alloy.

It has been found from more experimental data not explained in detail here that a following process makes it possible to produce a deposited film having a proper composition as a high magnetic permeability material. In the production process, the shutter 8 should first be closed till the concentration of aluminum of the vapor generated by heating with an electron beam decreases to a predetermined value between 20 and about 4 wt %. The composition of a film can be controlled by the length of the deposition time. The timing of the opening and the closing of the shutter can be determined from experimental data compiled in advance.

Sendust alloy films according to the present invention have been produced and have been studied on magnetic characteristics and other physical properties. An example is explained below.

An alloy tablet 5 has the same composition as that of the abovementioned experiment, that is, it is composed of 4 wt % Al, 27.5 wt % Si and the remainder of iron. It is put in the hearth 4. Substrates 2 are heated up to 400° C. An electron beam 7 sweeps the entire surface of the tablet 5, then the input power of the electron gun is increased. The shutter 8 is closed to intercept the deposition on the substrates 2 till three minutes passes after the power attains 10 kW. Then, the shutter 8 is opened during ten minutes to deposite the vapor on the substrates 2. A Sendust alloy film thus prepared is composed of 4.2 wt % Al, 9.4 wt % Si and the remainder of iron.

Figure 3:
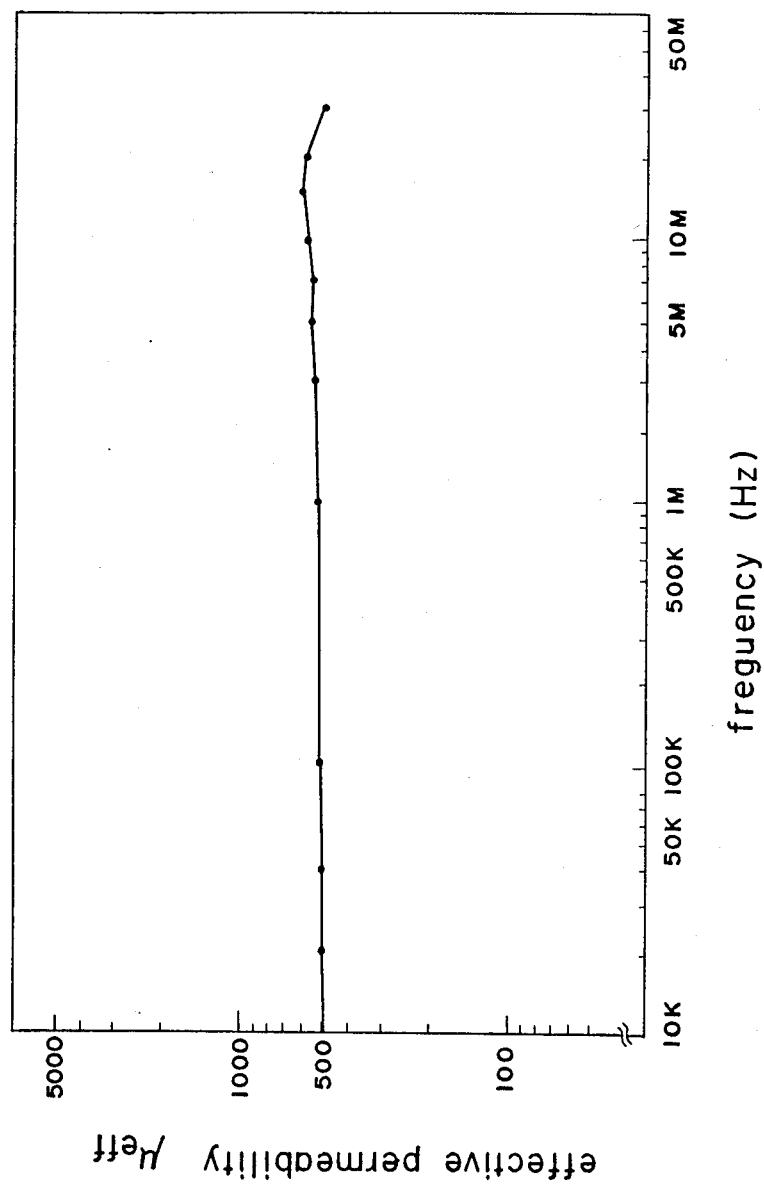
FIG. 3 is a graph of the frequency dependence of the effective magnetic permeability of a Sendust alloy film according to the present invention.

It is found that the film has excellent characteristics as a high magnetic permeability alloy film. Measurements of the film show that the film thickness is 4.5 μm, the saturation magnetic flux density 11,900 G, the electric resistivity 90 μΩ.cm, the coercive force 1.7 Oe, and the Vickers hardness 590. As shown in FIG. 3, the effective permeability $\mu_{eff}$ is reasonably high and rather constant up to a high frequency range till 30 MHz.

Figure 4:
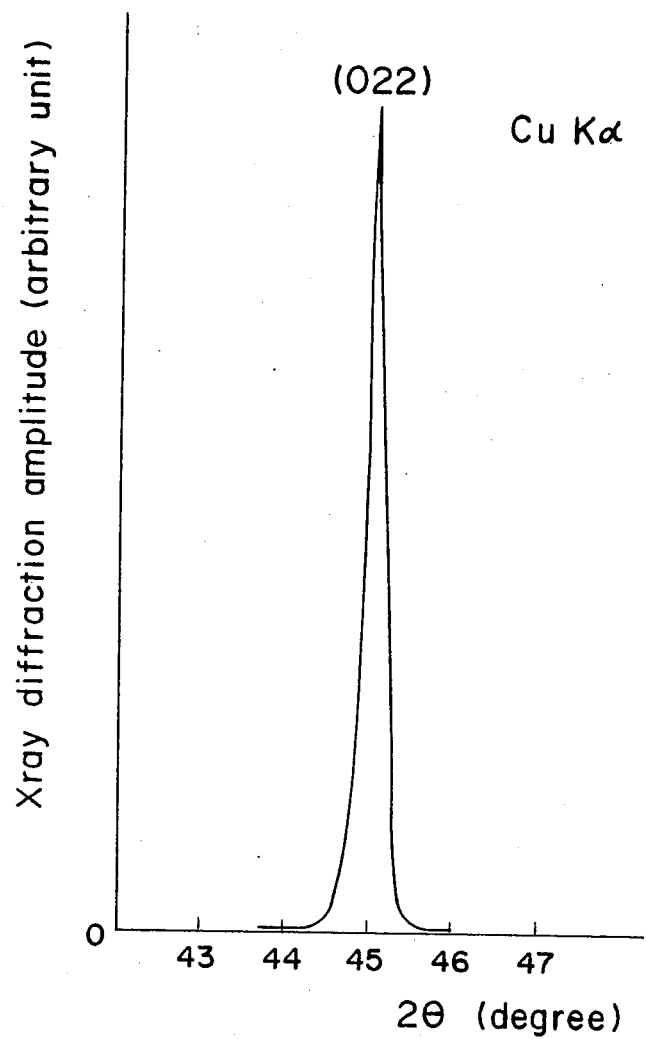
FIG. 4 is a graph of an X ray diffraction pattern of a Sendust alloy film according to the present invention.

It is considered necessary that a material has a crystal structure composed of very small crystal grains in order for the material to have high effective permeability at high frequencies. The films are analysed by X ray diffraction. FIG. 4 shows the X ray diffraction pattern at (022) planed of a deposited film. The grain size of the film is found to be about 300 Å by analysing the half width of the diffraction line (022) in FIG. 4 according to the Debye-Scherrer formula. From this analysis the crystal grains of the film are found to be very small.

While the embodiment of the present invention, as herein disclosed, constitutes a preferred form, other forms might be adopted without departing from the spirit or essential character thereof. For instance, while in the preferred embodiments, the shutter is closed any time after the input power of the electron beam attains 10 kW, a high permeability film can be produced without such a step. The preferred embodiment described herein are therefore illustrative and not restrictive.

What is claimed is:

1. A production method for producing a high permeability alloy film, comprising:

evaporating into a vapor a sendust alloy material containing 1-6 wt % Al, 20-35 wt % Si and the remainder being iron by irradiating said alloy with an electron beam; and depositing the vapor of the alloy material onto a substrate for a predetermined time to produce an alloy film composition having a high magnetic permeability suitable for use as a magnetic head material.

2. A production method for producing a high permeability alloy film, comprising:

evaporating into a vapor a sendust alloy material containing 1-6 wt % Al, 20-35 wt % Si and the remainder being iron by irradiating said alloy with an electron beam;

depositing the vapor of the alloy material onto a substrate for a predetermined time to produce an alloy film composition having a high magnetic permeability suitable for use as a magnetic head material; and controlling the vapor composition with a shutter means until a concentration of aluminum in the vapor has been decreased to a value between 20 and about 4 wt %.

3. The production method according to claim 1, wherein the deposition rate of the alloy film is 0.1-1 μm/min.

4. The production method according to claim 1, wherein the substrate has a thermal expansion coefficient of about $100-180+10^{-7}\,\text{deg}^{-1}$.

5. The production method according to claim 1, wherein the substrate is selected from the group consisting of photosensitive glass, crystalline glass, nonmagnetic ferrite, ceramics and stainless steel.

6. The production method according to claim 1, wherein the substates are heated to a temperature of between 100° and 600° C.

7. The production method according to claim 6, wherein the temperature is about 400° C.

8. The production method according to claim 1, wherein the evaporation and deposition steps are under a high vacuum.

9. The production method according to claim 2, wherein the electron beam has an input power of about 10 kW.

10. The production method according to claim 9, wherein the shutter means remains shut for about one minute after the input power reaches 10 kW.

11. The production method according to claim 1, wherein the film thickness is 4.5 μm.

12. The production method according to claim 1, wherein the effective permeability is reasonably high and constant up to a high frequency range of 30 MHz.

13. The production method according to claim 1, wherein the film has an x-ray diffraction pattern as shown in FIG. 4.

* * * * *